US006344150B1

(12) United States Patent
Eason et al.

(10) Patent No.: US 6,344,150 B1
(45) Date of Patent: Feb. 5, 2002

(54) ETCHING METHOD

(75) Inventors: Robert W. Eason, Southampton; Graeme W. Ross, Aberdeen; Peter G. R. Smith, Romsey; Ian E. Barry, Sindlesham, all of (GB)

(73) Assignee: Qinetiq Limited, Farnborough (GB)

( * ) Notice: Subject to any disclaimer, the term of this patent is extended or adjusted under 35 U.S.C. 154(b) by 0 days.

(21) Appl. No.: 09/403,084

(22) PCT Filed: Apr. 17, 1998

(86) PCT No.: PCT/GB98/01123

§ 371 Date: Nov. 23, 1999

§ 102(e) Date: Nov. 23, 1999

(87) PCT Pub. No.: WO98/46813

PCT Pub. Date: Oct. 22, 1998

(30) Foreign Application Priority Data

| Apr. 17, 1997 | (GB) | 9707769 |
| Jun. 24, 1997 | (GB) | 9713362 |
| Feb. 13, 1998 | (GB) | 9803164 |

(51) Int. Cl.[7] .......................... B44C 1/22; H01L 21/00
(52) U.S. Cl. .............. 216/24; 216/2; 216/99; 438/31; 438/43; 438/745
(58) Field of Search ................ 216/2, 24, 99; 438/31.32, 42, 43, 745, 756; 385/4, 146

(56) References Cited

U.S. PATENT DOCUMENTS 5,589,083 A  * 12/1996  Ahn et al. ................... 216/24

FOREIGN PATENT DOCUMENTS

EP        0 745 883        12/1996

OTHER PUBLICATIONS

Patent Abstracts of Japan, vol. 15, No. 167, Apr. 26, 1991 & JP 03 037194 A.
Patent Abstracts of Japan, vol. 17, No. 643, Nov. 29, 1993 & JP 05210132 A.
Patent Abstracts of Japan, vol. 17, No. 291, Jun. 4, 1993 & JP 05 017295 A.
Patent Abstracts of Japan, vol. 95, No. 11, Dec. 26, 1995 & JP 07 06600.

* cited by examiner

Primary Examiner—William A. Powell
(74) Attorney, Agent, or Firm—Nixon & Vanderhye P.C.

(57) ABSTRACT

A method of etching structural depressions in a substrate comprises aligning the ferroelectric domains within the substrate to domain orientations selected from two or more possible domain orientations, whereby the rate at which substrate material is etched by an etchant varies with the domain orientation of the substrate material; and exposing the substrate to the etchant.

36 Claims, 7 Drawing Sheets

ETCHING METHOD

BACKGROUND OF THE INVENTION

1. Field of the Invention

This invention relates to etching methods.

2. Discussion of Prior Art

Various techniques are currently used for etching substrates. These tend to rely either on masking areas of the substrate before exposing the substrate to an etching fluid (e.g. an acid), or etching by exposing areas of the substrate to a beam of particles or radiation.

These techniques all have drawbacks. Specific previously proposed techniques, together with their associated problems, are:

i) Mechanical sawing and milling: this is very limited in precision (blades and tools are normally greater than 100 microns) and thus are not suitable for making fine structures. They also lead to rough surface walls in the resulting structure.

ii) Particle beam and ion beam damage: in these techniques the sample is bombarded by ions resulting in the formation of a damage region in the sample. The damage region exhibits enhanced etching using a subsequent chemical etch. Such techniques are limited to make shallow structures due to limited penetration depth and uncertain straggling range. Repeated applications of the ion beams cannot be used to make deeper structures because of vignetting by the previous etching steps.

iii) Masking followed by etching: in this a mask layer (which could be photolithographically defined) results in some regions being exposed to etchant while other regions are protected. Such techniques are limited by undercutting, thus limiting the resolution and aspect ratio.

iv) Direct photon ablation (laser ablation): this can be used to make structures but leads to debris formation, imprecise features, cracking, melting and is limited to shallow structures and small aspect ratios (ratio of depth of feature to width of feature).

v) Laser imitated chemical reactions: this term includes several such techniques include sub-band-gap laser micro-machining and ultra-violet laser induced desorption, laser photo-thermal decomposition. The laser interacts directly with the material to melt, decompose or dissociate the material. It suffers from the same drawbacks as (iv).

vi) Reactive ion etching and reactive ion-beam etching: in these techniques ions are generated and impact a previously masked surface to remove material by direct impact or chemically assisted reactive species formation. These techniques are limited to shallow features, are expensive and have limited throughput. They do not exploit the underlying crystal morphology to give atomically smooth and controlled features.

vii) Ion beam milling: this technique, which is similar to (vi), uses an electromagnetically steered beam to control the pattern of etching. It has limited throughput, limited depth and can result in substrate faceting and re-deposition of sputtered material.

viii) Plasma, sputter and dry etching techniques: these are similar to (iii) but use a plasma environment instead of a wet-chemical etching environment.

All of these techniques are limited in various ways, but unlike the newly proposed etching method, none of them provide a crystallographically defined precision. Also because they all rely on surface masking they are limited in terms of making deep structures with high spatial resolution.

SUMMARY OF THE INVENTION

This invention provides a method of etching structural depressions in a substrate, the method comprising:

An etching process according to the invention involves a controlled inversion or alignment of ferroelectric domains in the substrate (e.g. through an electric poling process), followed by an etching of structural depressions which follows the domain-alignment boundaries.

The invention recognises that the domain structure imposed by a poling process can extend smoothly and potentially uniformly throughout the thickness of the substrate, or at least well into the substrate. The invention uses this to provide an etching method for potentially producing deep macroscopic features with precise (atomic scale) dimensions and positioning. Indeed, some of these advantages stem from the way in which the technique involves a modification of the bulk crystal at the unit cell level.

With the invention, structural depressions (e.g. greater than 1 $\mu$m deep) are created. This is quite different to any previous proposals to use differential etching techniques to allow chemical or electrical features of a substrate to be visualised (just creating a surface patterning).

Further respective aspects and features of the invention are defined in the appended claims.

BRIEF DESCRIPTION OF THE DRAWINGS

Embodiments of the invention will now be described by way of example only with reference to the accompanying drawings, throughout which like parts are denoted by like references and in which.

DETAILED DISCUSSION OF PREFERRED EMBODIMENTS

Figure 1:
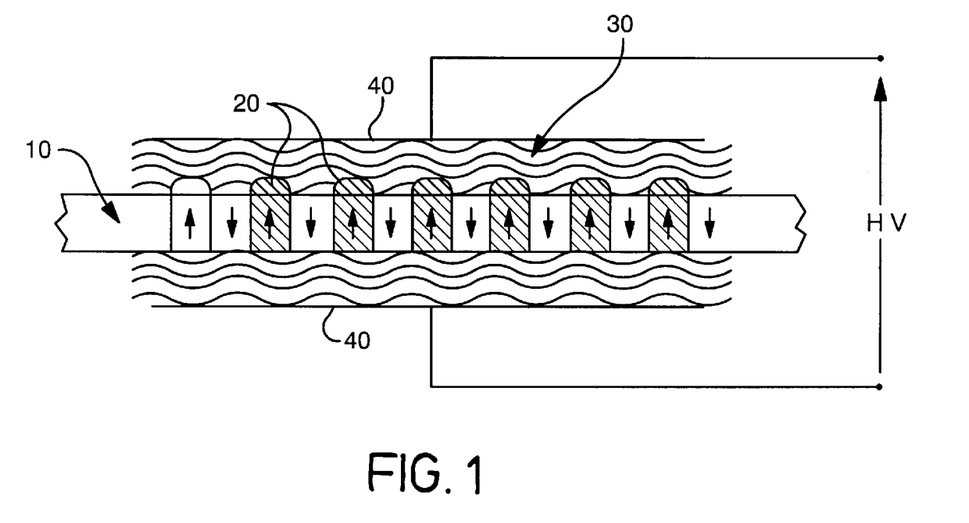
FIG. 1 is a schematic diagram illustrating a domain polling process applied to a lithium niobate crystal.

FIG. 1 is a schematic diagram illustrating a ferroelectric domain polling process applied to a lithium niobate crystal wafer 10.

In lithium niobate crystals there are two possible orientations of ferroelectric domains with respect to the fundamental crystal axes. (In other crystals such as barium titanate there can be six possible orientations, but the simpler example of lithium niobate will be described here). In FIG. 1, these two possible domain orientations are illustrated schematically as "up" (↑) and "down" (↓).

The aim of the polling operation illustrated schematically in FIG. 1 is to orient the domains of the crystal wafer prior to an etching process sensitive to domain orientation, so that the domain orientations set by the polling process determine an etching pattern in the crystal's surface resulting from the etching process.

Poling Process

The process steps in the controlled poling process of FIG. 1 are listed below. In this example, the crystal wafer 10 is between about 200 and 500 $\mu$m thick, and has been cut to an area of about 18 mm×25 mm. The crystal wafer is pre-poled at manufacture so that all of the domains are oriented in the same direction before the process described below commences. This pre-poling is carried out by applying a uniform electric field across the crystal during or after the crystal's growth. However, if a randomly-poled crystal were to be used, a pre-poling operation could be carried out first.

The basis of the technique is to apply a photo-resist material across the crystal, which is then selectively removed leaving a pattern of "clean" regions and regions covered by photo-resist on the crystal surface. The photo-resist is not itself used in its normal role to resist an etching process, but is simply used as an easily manipulatable electrically insulating material. An electric field is applied across the crystal faces. Where the photo-resist has been removed, the electric field poles the ferroelectric domains beneath to a particular direction. This does not happen where the photo-resist remains. The photo-resist is then removed and the differential etch rate between different domain orientations is relied upon to etch the desired shape into the material.

So, the detailed steps of the poling process are:
(a) the crystal wafer is cleaned in an ultrasonic bath at 50° C. using the following succession of solvents: (i) Loxotane (20 minutes); (ii) Acetone (20 minutes); (iii) Iso propanol (20 minutes); (iv) Water and micro-detergent (20 minutes); and (v) Water (20 minutes). The wafer is dried using a filtered air line.
(b) a layer of so-called Shipley S1813 photo-resist is spun onto the so-called -z face of the crystal surface at 5000 rpm. The crystal (with photo-resist) is baked in an oven at 90° C. for 35 minutes.
(c) the photo-resist is patterned using a Karl Suss mask aligner and a photolithographical mask, with an exposure of about 6 seconds. This process exposed a series of parallel lines across the photo-resist, to form a grating structure aligned parallel to a notional "grating vector" in the plane of the photo-resist layer. In this process, the wafer is aligned so that the grating vector is parallel to the x-axis of the crystal.

The mask is arranged so that the resulting etched grating has a desired 50:50 mark-space ratio. Because "domain spreading" (an electrical rather than an etching phenomenon) occurs so that the etched area can be broader than the polled area, the polled area is made deliberately narrow to compensate. In this example, the mask comprises 0.8 $\mu$m strips (openings) set 5.95 $\mu$m apart. (Having said this, in FIG. 1 the strips are shown the same size as the gaps between adjacent strips merely to make the schematic representation of FIG. 1 easier to understand).

(d) the photo-resist is developed in Shipley MFD developer for 50 seconds and washed in water for 2 minutes, then dried using a filtered air line. This leaves strips of photo-resist, shown schematically in cross-section in FIG. 1, about 0.8 $\mu$m wide.
(e) in preparation for an electrical poling operation, a conductive gel 30 is spread over the photo-resist area. (In this example, medical "ECG" gel designed to enhance the connection between a human patient's skin and metal electrodes is used). To avoid spreading of the gel and to prevent electrical breakdown the edge regions of the wafer 10 are masked using strips plastics adhesive insulating tape (not shown). Brass electrodes 40 are then placed in electrical contact with the gel layer.
(f) the sample is then poled by applying a pulsed high voltage electric field across the brass electrodes 40. The pulses are provided by a high voltage constant current power supply, to be described below with reference to FIG. 2. The electric field is at or close to the coercive field for the material in use—of the order of 22 kV/mm (kilovolts per millimetre) for lithium niobate, and is applied to the wafer at positions where the conductive gel contacts the wafer surface. Where the photo-resist layer 20 comes between the gel 30 and the wafer surface, the electric field does not influence the domain orientation.

The result is therefore a poled domain structure as shown schematically in FIG. 1, with alternate regions of the two domain orientations.

(g) once the wafer domains have been poled, the wafer can be viewed through a polarising microscope to assess and check the domain structure. The contrast observed in the image through such a microscope results from stresses within the domain-manipulated material.

Constant Current Power Supply

Figure 2:
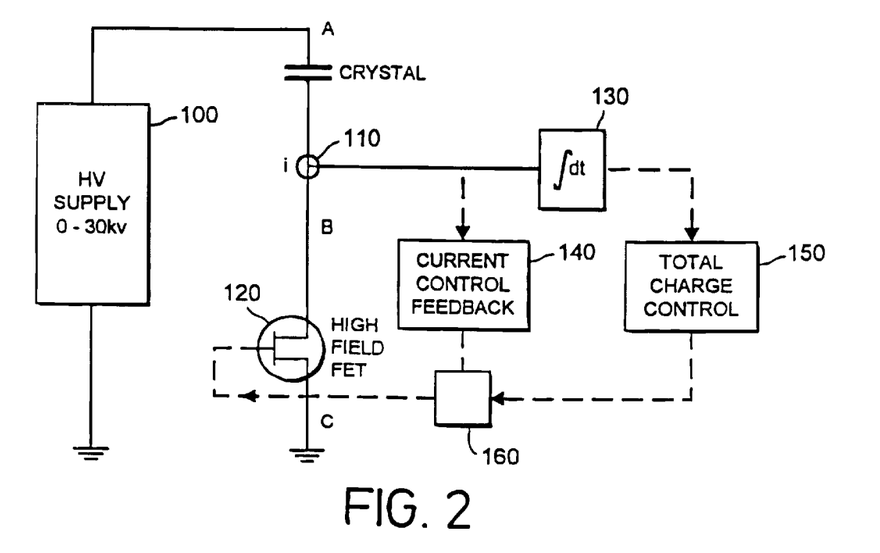
FIG. 2 is a schematic diagram of a constant current power supply.

FIG. 2 schematically illustrates the constant current power supply connected across the brass electrodes 40 applied to the gel 30 of FIG. 1.

The power supply comprises a standard high voltage (0–30 kV) supply 100 connected between earth and the brass electrode at one face of the crystal. The brass electrode at the other face of the crystal is connected via a current-sensing element 110 (e.g. a known value resistor with voltage sensors at either terminal, opto-isolated from the integrator and current controller (see below) because of the high voltages in use) and, via a current-controlling FET transistor 120 to earth.

The output of the current sensing element 110 is supplied in parallel to an integrator 130 and to a current controller 140. The integrator 130 generates an electrical signal indicative of the integral of the current through the crystal, or in other words the total charge supplied to the crystal. This is compared (by a total charge controller 150) with a total required charge amount set by the user, to generate a gating signal indicating whether or not further current should be allowed to pass through the crystal. The current controller compares the instantaneous current with a required current value set by the user, and generates a current control signal to control the amount of current that the FET allows to pass.

The current control signal from the current controller 140 is combined with the current gating signal from the total charge controller in a combiner 160.

The FET 120 controls the current flowing through the crystal in dependence on the gated current control signal from the combiner 160. So, as long as the total required charge has not been reached, the instantaneous current is controlled to be constant or near-constant by the current controller 140. When the total required charge is reached, the gating effect of the total charge controller causes the FET to switch off, passing substantially no more current.

Etching Process

The wafer is then etched in a mixture of about 33% hydrofluoric acid (48% concentration) and about 67% nitric acid (69–71% concentration), for a period of several minutes through to a number of hours. The exact proportions and concentrations of the acid mixture are not critical to the etching operation.

The basis of the etching process is that the etching rate for differently-oriented domains is quite different, so that the poling structure applied to the crystal domains results in a physical structure being produced by differential etching of the crystal surface.

The etch rate at room temperature is about 1 $\mu$m per hour, but this is subject to strong influence by varying the temperature of the etch solution and the ratio of the etchant chemicals.

Figure 3:
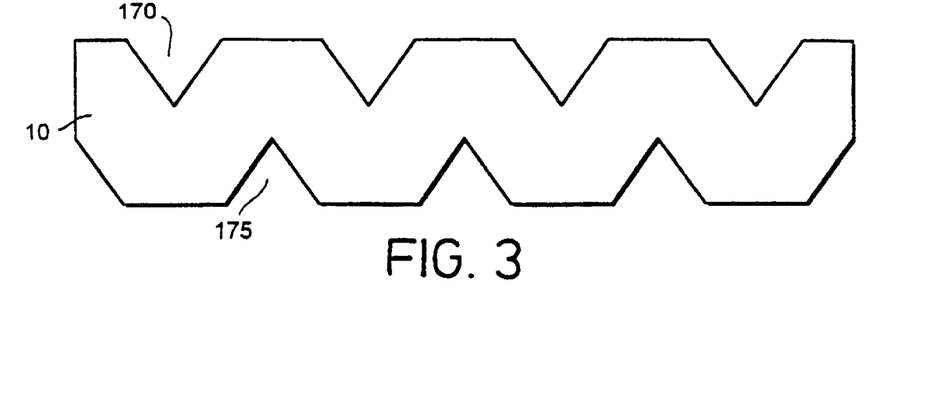
FIGS. 3 and 4 are schematic cross-sections of an etched crystal.
Figure 4:
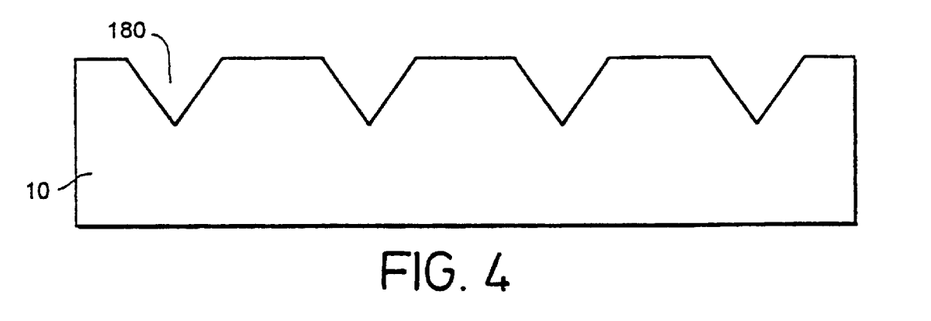
Figure 5:
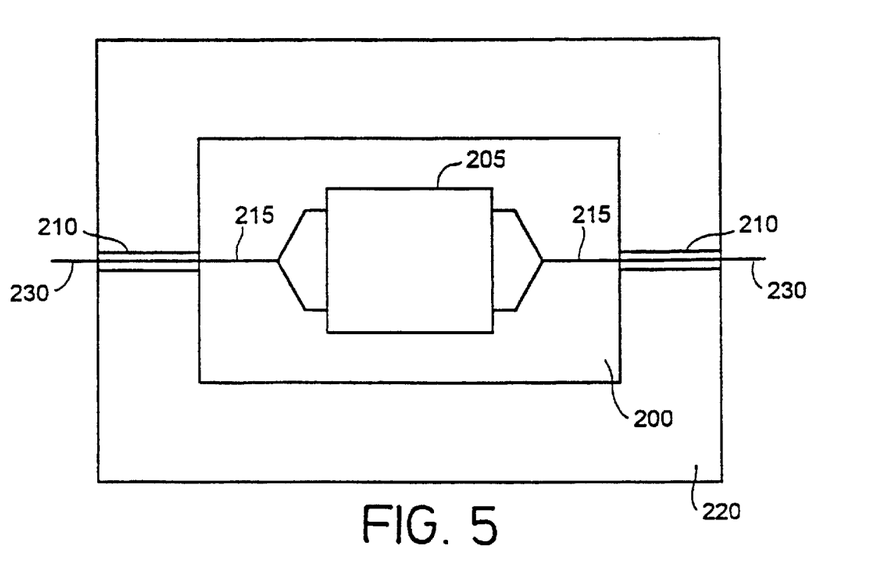
FIG. 5 is a schematic plan view of an integrated circuit.

FIGS. 3 and 4 are schematic cross sections of the resulting etched crystal.

FIG. 3 shows the situation where the domains were uniformly poled through the entire depth of the crystal wafer and then both upper and lower faces of the crystal were exposed to the etchant acid. FIG. 4 illustrates the situation where only the upper face (as drawn) of the crystal was exposed to the etchant acid.

Where the etchant acid has contacted the crystal face, it has etched smooth, V-shaped channels greater than 1 $\mu$m deep 170, 175, 180 where the domains were in one orientation, but has hardly removed any material where the domains were in the other orientation. This has resulted in the desired 50:50 mark-space ratio grating structure.

In the case of FIG. 3, it can be seen that the etched patterns on the two faces are spatially complementary, so that an etched channel 175 on one face overlies the gap between two etched channels 170 on the other face. This is caused by the way in which the differential etching by the acid operates. Referring back to FIG. 1, alternate regions of opposite domain orientation are created. The acid preferentially etches one "end" of each domain, whichever way that domain is actually oriented. So, if the acid can be considered to preferentially etch the end of each domain indicated by the arrow head in FIG. 1, this will lead to the complementary etching patterns of FIG. 3.

FIG. 4 schematically illustrates an integrated circuit 200, demonstrating another application for etched channels 210 as described above. In the integrated circuit, signals are received for processing and/or output after processing in optical form. This relies on very precise alignment between pigtailed optical fibres 230 and waveguides 215 leading to the appropriate electro-optic parts of the integrated circuit (e.g. a modulator 205).

Using the techniques described above, precise, V-shaped channels 210 can be etched into areas of substrate 220 outside of the integrated circuit itself, and can then be sued as guides to locate the pigtail fibres into the correct positions. For this use, the grooves might be about 60 $\mu$m deep.

Although the example above referred to lithium niobate, many other ferroelectric crystals or other materials could be used as substrates for this process. The following is a non-limiting list of examples:

lithium tantalate
doped lithium tantalate
doped lithium niobate
KTP and its isomorphs
barium titanate
strontium barium titanate
potassium strontium niobate
potassium lithium niobate
polymeric or glassy hosts which can be poled The etching process could involve different chemicals or combinations of chemicals, or etching using different phases (e.g. glass and solid), providing there is a differential etch rate between differently poled domains. It is also possible to use charged species for etching, e.g. ion etching and plasma etching schemes.

Applications

Other exposure formats can be used apart from grating structures. The photo-resist technique permits the generation of squares, triangles, lines, islands, mesas, "corner-cube"boxes, microscopic holes (e.g. for filtering, sieving, refining or sorting) and other geometrical shapes. The structures produced by prototypes of this technique have been of optical waveguide quality, in terms of the smoothness and uniformity of the surface finish. Indeed, close examination of the surfaces by electron microscope leads to the supposition that the surfaces are possibly smooth to atomic (unit cell) accuracy.

The process can be used to fabricate the tiny structures needed to produce tips for atomic force microscopy. Indeed, if the tips are produced from lithium niobate they have the added advantages over conventional tips made from silicon nitride or silicon carbide that the material is optically transparent, electro-optic, piezoelectric, pyroelectric and photorefractive.

Figure 6A:
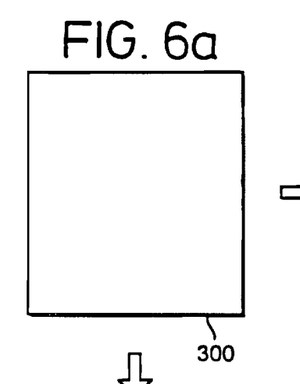
FIGS. 6a, 6b and 6c schematically illustrate the formation of a tip for atomic force microscopy (AFM)
Figure 6B:
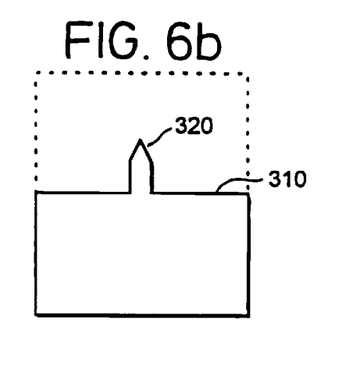
Figure 6C:
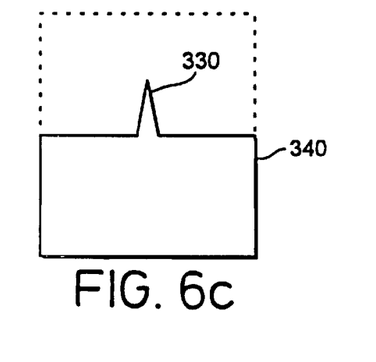

FIGS. 6a, 6b and 6c schematically illustrate the formation of AFM tips.

Starting from a crystal blank 300, most of a layer of the crystal is etched away by the above technique leaving just a parallel-sided tip 320 on a base member 310 (FIG. 6b) or a pointed tip 330 on a base member 340 (FIG. 6c). The base member is then used to support the tip in known AFM apparatus.

Figure 7:
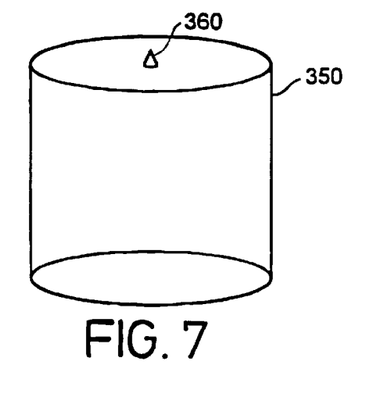
FIG. 7 schematically illustrates an AFM tip.

FIG. 7 is a schematic perspective view of an AFM tip 360 on a base member 350 produced by this technique.

A further application is in the area of sensors. If a lithium niobate crystal has micro-apertures etched into its surface using this technique, the crystal's bulk electro-optic, piezoelectric, pyroelectric and/or photorefractive properties can be modified by the adsorption of other materials into the micro-apertures. The degree of modification is an indication of the concentration, orientation, position and nature of the adsorbate.

Another application is in the fabrication of complementary male and female formations on separate crystal samples, which can interlock with one another to hold the two samples together. This can assist in forming long or intentionally "flip-chipped" devices.

Further examples of the use of this technique are in producing photonic band gap structures (which require regular arrays of microscopic scale features at the micron to sub-micron scale length). These structures, coupled with further processing via pixellated electrode structures may lead to devices including programmable graded index lenses, steerable array structures and pixellated laser arrays.

Figure 8:
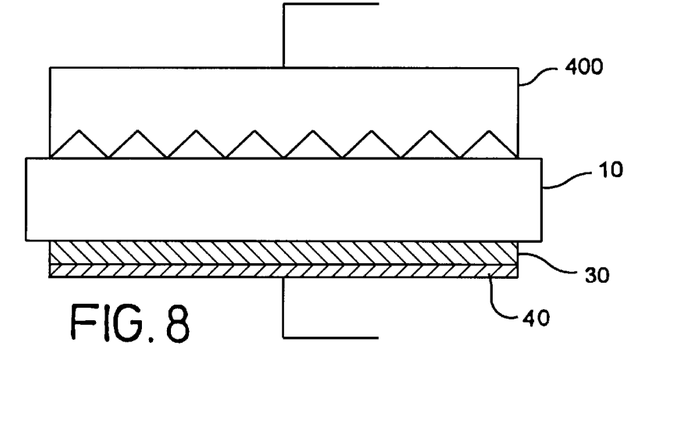
FIG. 8 schematically illustrates another technique of domain poling.

Finally, FIG. 8 schematically illustrates another technique for poling the crystal.

A metal blank is etched using conventional techniques to form an electrode 400 having protruding formations. The electrode 400 is pressed against the crystal wafer 10 and is connected to one pole of the HV supply. On the other face of the crystal, a similar electrode could be used, or (as shown in FIG. 8) the conductive gel connection described above could be employed.

So, using the electrode of FIG. 8, the crystal is poled at and around the positions where the electrode 400 contacts the crystal wafer 10.

Alignment Formations

Figure 9:
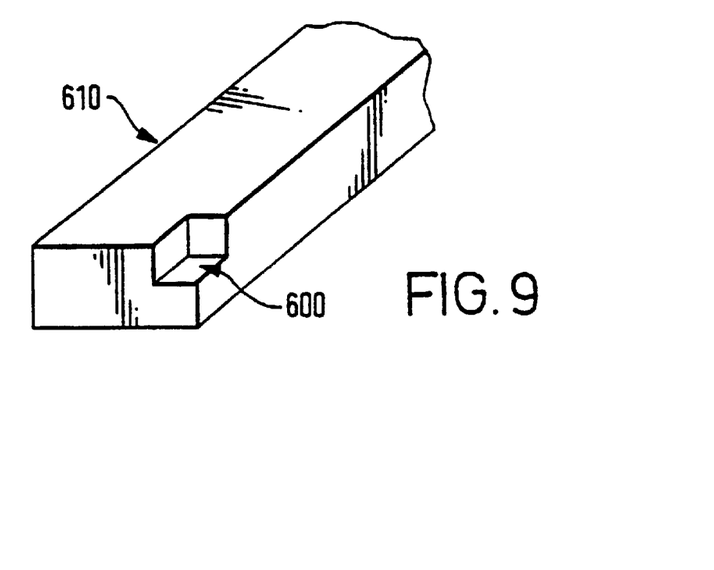
FIG. 9 schematically illustrates an etched alignment key.

Referring now to FIG. 9, a key structure 600, effectively an etched internal corner, can be used as an alignment formation to align different substrates to be abutted together.

Figure 10:
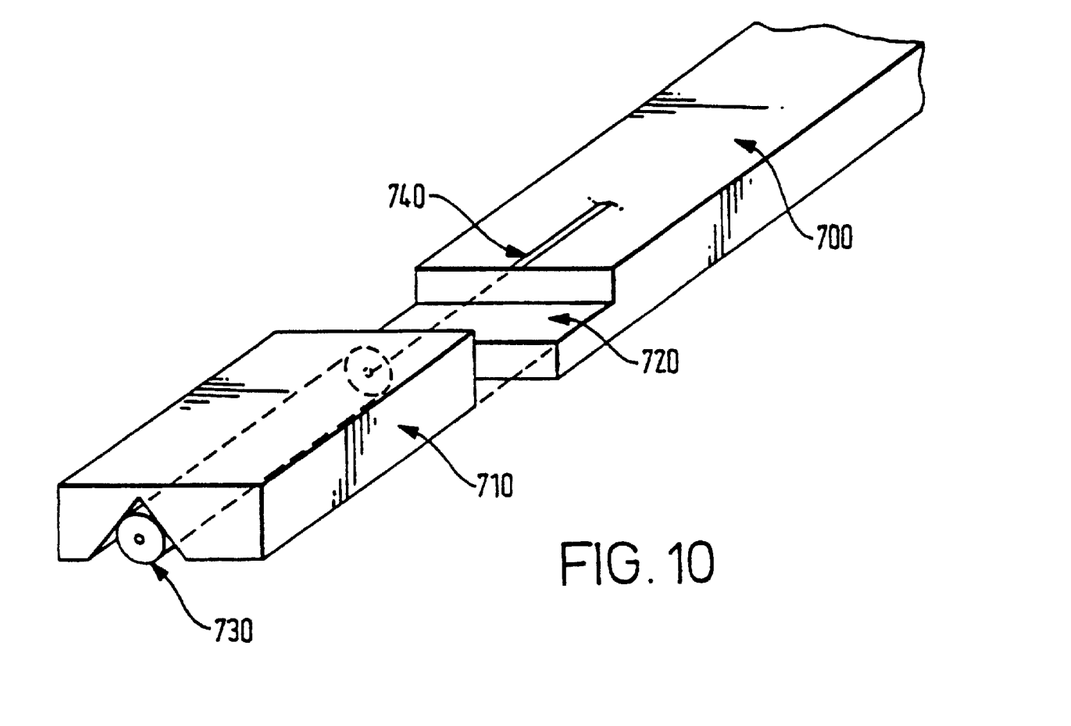
FIG. 10 schematically illustrates the mating of complementary formations on silicon and lithium niobate substrates.

FIG. 10 schematically illustrates the mating of complementary formations on silicon 710 and lithium niobate 700 substrates.

The use of V-grooves on silicon substrates (formed by conventional anisotropic etching processes different to those described above) is known. Such grooves have been used as optical fibre alignment aids. In FIG. 10, an optical fibre 730 is illustrated in a V-groove formed in the silicon substrate 710.

In the so-called "flip chip", a chip or substrate of lithium niobate is bonded to a silicon wafer, to form a hybrid chip. Previously, in optical applications, the alignment between optical waveguides on the lithium niobate chip and the silicon substrate has been carried out by trial and error, basically moving the two with respect to one another until the best coupling between the waveguides is achieved. This is a time consuming and therefore expensive process.

In FIG. 10, in contrast, alignment formations 720 are precisely etched using the above technique onto the lithium niobate substrate 700. As shown, the alignment formation is a shelf formation on which the silicon substrate, with the fibre 730 in its V-groove, sits so that the core of the fibre 730 is aligned with a waveguide 740 formed on the lithium niobate substrate's surface.

As drawn, this provides vertical alignment but does not provide lateral alignment of the two substrates. However, in another embodiment (not shown), a corner formation of the type shown in FIG. 9 is produced at one end of the "shelf" formation to provide lateral alignment as well.

In other embodiments, complementary alignment "pegs" and "holes" could be provided on the substrates to be aligned together.

In general, complementary alignment formations can be provided on each of two or more integrated circuit substrates, with the alignment formations on at least one of the substrates being formed by the etching techniques defined above.

Thicker Structures

The crystal wafers 10 described above are between about 200 and 500 $\mu$m thick. This is a convenient thickness to use with an applied polling voltage from, say, a 0–30 kV supply. Thicker (single) wafers can of course be polled for etching, but the required voltage is greater. However, a technique which allows thicker structures to be etched but without the need for correspondingly greater voltages will now be described with reference to FIGS. 11 and 12.

Figure 11:
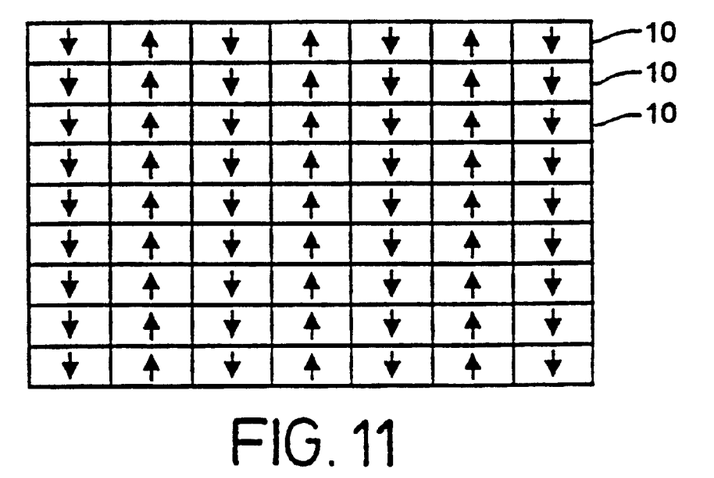
FIG. 11 schematically illustrates a stack of poled wafers.

FIG. 11 schematically illustrates a stack of polled wafers 10. Each wafer may be of a convenient thickness—e.g. 500 $\mu$m thick—and is individually polled as described above. The wafers are then stacked and bonded together to form a composite, but much thicker, structure.

The bonding technique is direct (also known as thermal) bonding. This can be achieved by polishing the crystal wafers to a high degree of flatness—e.g. by using a conventional polishing machine, lapping with 9 $\mu$m followed by 3 $\mu$m lapping compound and then polishing with Syton polishing fluid. The samples are cleaned using ecoclear solvent, acetone, IPA and/or water. The samples are then immersed in a solution of hydrogen peroxide and ammonia to aid bonding. When the samples are firmly pressed together, a bond forms. Heat treatment, e.g. to a temperature of up to about 500° C., can help to strengthen the bond.

In the stacking process, the polled wafers tend to self-align so that like-polled areas are stacked over one another. This is because any other arrangement would lead to electrostatic repulsion between surface charges on the wafers.

Figure 12:
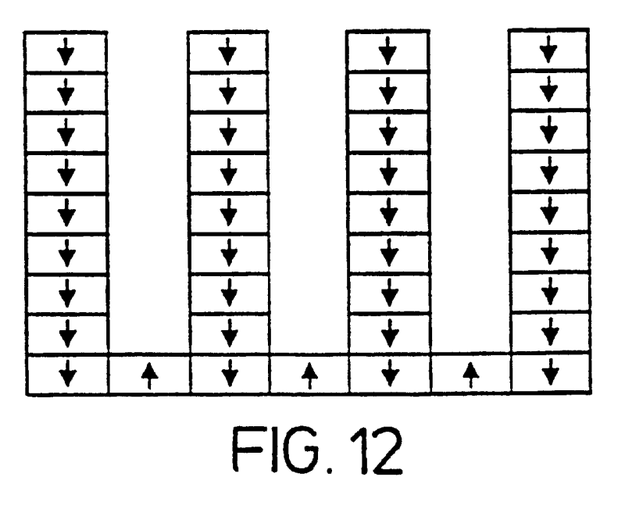
FIG. 12 schematically illustrated the stack of FIG. 11 as etched using etching techniques according to embodiments of the invention.

FIG. 12 schematically illustrates such a stack of wafers after etching. Fine structures of much greater depth than the 500 $\mu$m thickness of a single wafer can be formed in this way, without the need to increase the polling voltage dramatically.

Acoustic Devices

Figure 13:
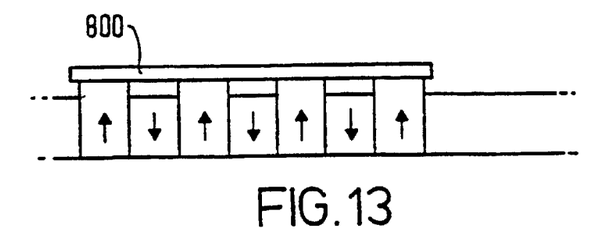
FIG. 13 schematically illustrates a set of electrodes.

The techniques lend themselves to use in the manufacture of acoustic (bulk or surface) devices. FIG. 13 schematically illustrates a set of spatially periodic electrodes suitable for use in, for example, a surface acoustic wave (SAW) device. The electrodes are formed by pressing or mounting an electrical conductor 800 against an etched relief structure in lithium niobate as illustrated.

Figure 14:
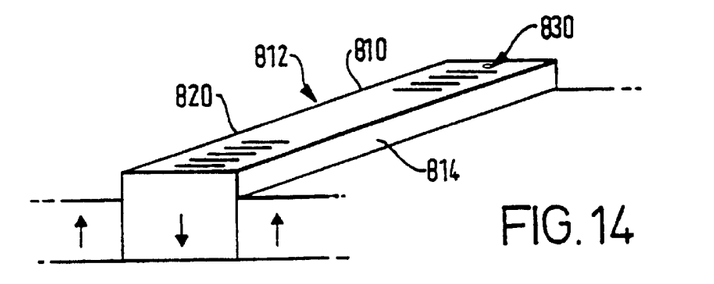
FIG. 14 schematically illustrates an acoustic waveguide.

FIG. 14 schematically illustrates an acoustic waveguide, making use of a ridge structure 810 etched in lithium niobate using the above techniques. The acoustic wave is launched by electrodes 820 and received by electrodes 830, and is constrained by the two faces 812, 814.

Figure 15:
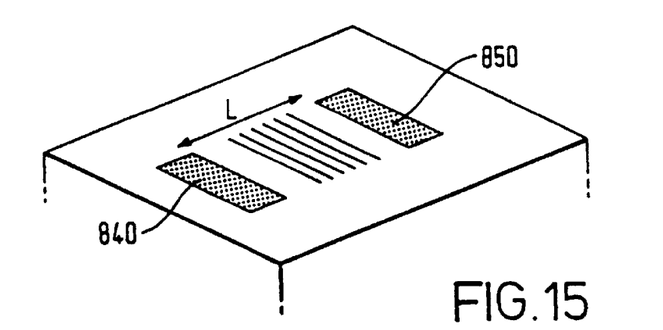
FIG. 15 schematically illustrates a surface acoustic wave device.

FIG. 15 schematically illustrates a surface acoustic wave device in which holes or surface depressions 840, 850 etched using the above techniques form a region of length L in which only resonant acoustic waves can propagate. In this way, acoustic filtering can be performed.

Figure 16:
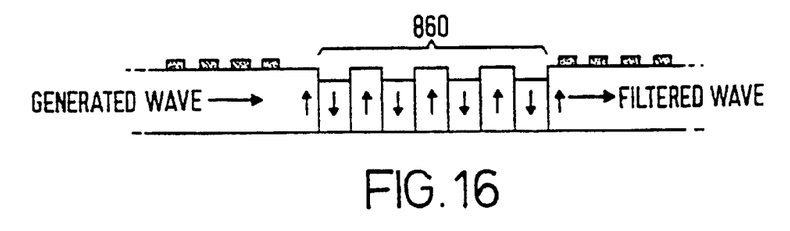
FIG. 16 schematically illustrates a surface acoustic wave device.

Similarly, in FIG. 16 a relief structure 860 in the form of a grating between the generating and receiving electrodes can provide some acoustic filtering.

Figure 17:
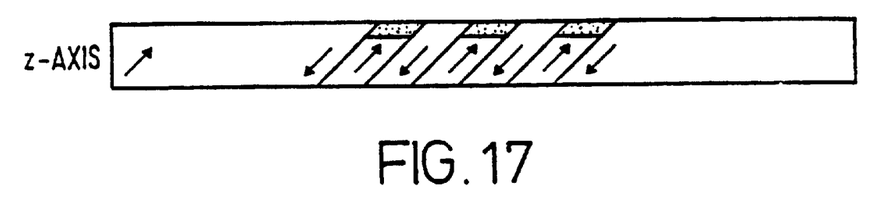
FIG. 17 schematically illustrates a crystal wafer in which the z-axis is not normal to the plane face.

FIG. 17 schematically illustrates a crystal wafer in which the z-axis is not normal to the plane face. Examples which are readily available include lithium niobate wafer cut at 128° Y-X, lithium tantalate X-112° and lithium tantalate 36° Y-X. Such cuts are known for use in SAW devices. As shown in FIG. 17, the domain walls are at an angle, but the domains can still be polled and surface structures formed as described above. Accordingly, even with a component of the z-axis pointing out of a face of the crystal, the technique can still be applied.

Figure 18:
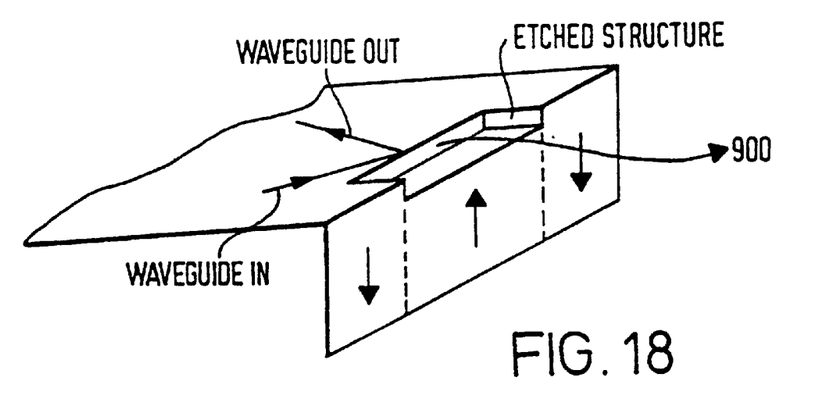
FIGS. 18 and 19 schematically illustrate a mirror device.
Figure 19:
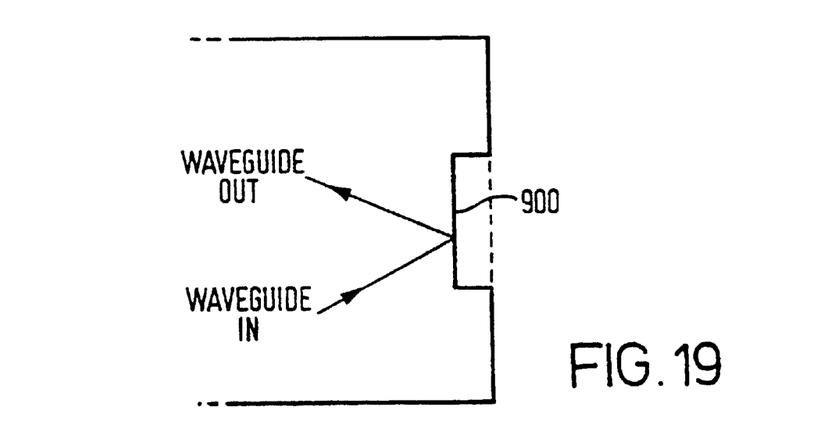

FIGS. 18 and 19 schematically illustrate a mirror device. Here, an abrupt interface 900 is provided in a light propagation path—e.g. a waveguide defined by titanium-indium diffusion into the material. FIG. 19 illustrate the arrangement of FIG. 18 in plan view.

In summary, by using a combination of domain inversion and selective domain etching it is possible to fabricate surface relief structures for a number of possible applications relating to the manufacture and operation of acoustic devices. The applications described above apply equally to bulk acoustic devices.

What is claimed is:

1. A method of etching structural depressions in a substrate, the method comprising:
   aligning at least some of the ferroelectric domains within the substrate to domain orientations selected from two or more possible domain orientations, whereby the rate at which substrate material is etched by an etchant varies with the domain orientation of the substrate material; and
   exposing the substrate to the etchant;
   in which the structural depressions are substantially V-shaped in cross section.

2. A method of etching a region of a substrate to leave a protruding elongate formation, the method comprising:

aligning at least some of the ferroelectric domains within the substrate to domain orientations selected from two or more possible domain orientations, whereby the rate at which substrate material is etched by an etchant varies with the domain orientation of the substrate material; and exposing the substrate to the etchant.

3. A method of fabricating alignment formations on an integrated circuit substrate for use in aligning external connecting members with the integrated circuit, the method comprising:

aligning at least some of the ferroelectric domains within the substrate to domain orientations selected from two or more possible domain orientations, whereby the rate at which substrate material is etched by an etchant varies with the domain orientation of the substrate material; and exposing the substrate to the etchant.

4. A method according to claim 1, in which the aligning step comprises:

applying an electric field across selected regions of the substrate, to align the domains within those regions to an orientation dependent on the electric field.

5. A method according to claim 4, in which the aligning step comprises:

connecting electrodes respectively to (i) selected regions of one face of the substrate and (ii) at least regions of another face of the substrate; and applying a potential difference between the electrodes.

6. A method according to claim 5, in which the aligning step comprises:

maintaining a substantially constant current flow between the electrodes.

7. A method according to claim 5, comprising:

allowing current to flow between the electrodes until a charge flowed between the electrodes.

8. A method according to claim 4, in which the aligning step comprises:

applying an insulating material to selected parts of the surface of the substrate, the insulating material acting to inhibit realignment of the domains in substrate material beneath the insulating material when the electric field is applied.

9. A method according to claim 8, in which the aligning step comprises:

applying a light-sensitive insulating material to the substrate;

exposing parts of the insulating material to light;

applying an insulator removing material which selectively removes insulating material from the substrate in dependence on whether the insulating material has been exposed to light.

10. A substrate having etched formations produced by a method according to claim 1.

11. An atomic force microscopy sensing tip produced by a method according to claim 2.

12. A method according to claim 3, in which the alignment formations are elongate grooves.

13. An integrated circuit substrate having alignment formations fabricated by a method according to claim 3.

14. A pair of integrated circuit substrates having complementary alignment formations for aligning the substrates with respect to one another, the alignment formations on at least one of the substrates being fabricated by a method according to claim 3.

15. A flip chip in which a substrate of one crystal material is mounted on a substrate of another crystal material, the substrates having complementary alignment formations, the alignment formations on at least one of the substrates being fabricated by a method according to claim 3.

16. A method of forming an etched structure, comprising the steps of:

aligning ferroelectric domains within each of two or more substrates to domain orientations selected from two or more possible domain orientations, whereby the rate at which substrate material is etched by an etchant varies with the domain orientation of the substrate material;

bonding the two or more substrates together so that oriented domains in one substrate substantially overlie like-oriented domains in an adjacent substrate;

exposing the bonded substrates to the etchant.

17. An acoustic wave device having acoustic wave guiding or filtering formations etched using a method according to claim 1.

18. An optical waveguide device having an optical reflecting surface formed using an etching method according to claim 1.

19. A method according to claim 2, in which the aligning step comprises:

applying an electric field across selected regions of the substrate, to align the domains within those regions to an orientation dependent on the electric field.

20. A method according to claim 19, in which the aligning step comprises:

connecting electrodes respectively to (i) selected regions of one face of the substrate and (ii) at least regions of another face of the substrate; and applying a potential difference between electrodes.

21. A method according to claim 20, in which the aligning step comprises:

maintaining a substantially constant current flow between the electrodes.

22. A method according to claim 20, comprising:

allowing current to flow between the electrodes until a charge has flowed between the electrodes.

23. A method according to claim 19, in which the aligning step comprises:

applying an insulating material to selected parts of the surface of the substrate, the insulating material acting to inhibit realignment of the domains in substrate material beneath the insulating material when the electric field is applied.

24. A method according to claim 23, in which the aligning step comprises:

applying a light-sensitive insulating material to the substrate;

exposing parts of the insulating material to light;

applying an insulator removing material which selectively removes insulating material from the substrate in dependence on whether the insulating material has been exposed to light.

25. A substrate having etched formations produced by a method according to claim 2.

26. An acoustic wave device having acoustic wave guiding or filtering formations etched using a method according to claim 2.

27. An optical waveguide device having an optical reflecting surface formed using an etching method according to claim 2.

28. A method according to claim 3, in which the aligning step comprises:

applying an electric field across selected regions of the substrate, to align the domains within those regions to an orientation dependent on the electric field.

29. A method according to claim 28, in which the aligning step comprises:

connecting electrodes respectively to (i) selected regions of one face of the substrate and (ii) at least regions of another face of the substrate; and applying a potential difference between electrodes.

30. A method according to claim 29, in which the aligning step comprises:

maintaining a substantially constant current flow between the electrodes.

31. A method according to claim 29, comprising:

allowing current to flow between the electrodes until a charge has flowed between the electrodes.

32. A method according to claim 28, in which the aligning step comprises:

applying an insulating material to selected parts of the surface of the substrate, the insulating material acting to inhibit realignment of the domains in substrate material beneath the insulating material when the electric field is applied.

33. A method according to claim 32, in which the aligning step comprises:

applying a light-sensitive insulating material to the substrate;

exposing parts of the insulating material to light;

applying an insulator removing material which selectively removes insulating material from the substrate in dependence on whether the insulating material has been exposed to light.

34. A substrate having etched formations produced by a method according to claim 3.

35. An acoustic wave device having acoustic wave guiding or filtering formations etched using a method according to claim 3.

36. An optical waveguide device having an optical reflecting surface formed using an etching method according to claim 3.

* * * * *